(12) United States Patent
Lee et al.

(10) Patent No.: US 8,390,110 B2
(45) Date of Patent: Mar. 5, 2013

(54) INTEGRATED CIRCUIT PACKAGING SYSTEM WITH CAVITY AND METHOD OF MANUFACTURE THEREOF

(75) Inventors: Sang-Ho Lee, Yeoju (KR); Taewoo Lee, Icheon-Si (KR); Soo-San Park, Seoul (KR)

(73) Assignee: STATS ChipPAC Ltd., Singapore (SG)

( * ) Notice: Subject to any disclaimer, the term of this patent is extended or adjusted under 35 U.S.C. 154(b) by 501 days.

(21) Appl. No.: 12/582,582

(22) Filed: Oct. 20, 2009

(65) Prior Publication Data

US 2011/0089554 A1 Apr. 21, 2011

(51) Int. Cl.
*H01L 23/48* (2006.01)

(52) U.S. Cl. ........ 257/690; 257/686; 257/E21.502; 257/E23.01; 438/124

(58) Field of Classification Search ........ 257/686, 257/690; 438/124
See application file for complete search history.

(56) References Cited

U.S. PATENT DOCUMENTS

| | | | |
|---|---|---|---|
| 7,354,800 B2 | 4/2008 | Carson | |
| 7,364,945 B2* | 4/2008 | Shim et al. | 438/109 |
| 7,504,285 B2 | 3/2009 | Corisis et al. | |
| 7,687,897 B2* | 3/2010 | Ha et al. | 257/686 |
| 7,968,991 B2* | 6/2011 | Wong et al. | 257/686 |
| 8,106,498 B2* | 1/2012 | Shin et al. | 257/686 |
| 2006/0220259 A1* | 10/2006 | Chen et al. | 257/778 |
| 2008/0006925 A1* | 1/2008 | Yim et al. | 257/686 |
| 2008/0105984 A1* | 5/2008 | Lee | 257/777 |
| 2008/0227238 A1* | 9/2008 | Ko et al. | 438/108 |
| 2008/0284066 A1 | 11/2008 | Kuan et al. | |
| 2009/0001540 A1 | 1/2009 | Yang et al. | |
| 2009/0014858 A1* | 1/2009 | Boon et al. | 257/686 |
| 2009/0059885 A1* | 3/2009 | Sadek et al. | 370/343 |
| 2009/0072375 A1* | 3/2009 | Song et al. | 257/686 |
| 2009/0091903 A1* | 4/2009 | Hsu et al. | 361/761 |
| 2009/0152701 A1* | 6/2009 | Kuan et al. | 257/686 |
| 2009/0166825 A1* | 7/2009 | Camacho et al. | 257/676 |
| 2009/0166885 A1* | 7/2009 | Tay et al. | 257/777 |
| 2009/0236735 A1* | 9/2009 | Corisis et al. | 257/723 |
| 2009/0258494 A1* | 10/2009 | Yee et al. | 438/694 |
| 2009/0302452 A1 | 12/2009 | Camacho et al. | |
| 2010/0140809 A1* | 6/2010 | Chow et al. | 257/777 |
| 2010/0237483 A1* | 9/2010 | Chi et al. | 257/686 |
| 2010/0314738 A1* | 12/2010 | Chi et al. | 257/686 |
| 2011/0062602 A1* | 3/2011 | Ahn et al. | 257/787 |
| 2011/0079899 A1* | 4/2011 | Ong et al. | 257/737 |

OTHER PUBLICATIONS

U.S. Appl. No. 12/205,841, filed Sep. 5, 2008, Kuan et al.

* cited by examiner

*Primary Examiner* — A. Sefer

(74) *Attorney, Agent, or Firm* — Ishimaru & Associates LLP; Mikio Ishimaru

(57) ABSTRACT

A method of manufacture of an integrated circuit packaging system includes: mounting a substrate-less integrated circuit package, having a terminal having characteristics of an intermetallic compound, over a substrate; connecting the substrate and the substrate-less integrated circuit package; and forming a base encapsulation over the substrate-less integrated circuit package with the terminal exposed.

20 Claims, 4 Drawing Sheets

INTEGRATED CIRCUIT PACKAGING SYSTEM WITH CAVITY AND METHOD OF MANUFACTURE THEREOF

TECHNICAL FIELD

The present invention relates generally to an integrated circuit packaging system, and more particularly to a system for an integrated circuit packaging system with cavity.

BACKGROUND ART

Electronic devices, such as smart phones, personal digital assistants, location based devices, digital cameras, music players, computers, or transportation, have become an integral part of many daily activities. Key components of these electronic devices are integrated circuit devices. These tiny integrated circuits must perform during daily activities including a wide variety of environmental conditions as well as potentially damaging forces. Many and varied types of packaging, intended for protection, interconnection or mounting, have been developed for integrated circuit devices.

Wafer manufacturing strives to reduce transistor or capacitor feature size in order to increase circuit density and enhance functionality of these integrated circuits. Reduced feature size has been quite successful in improving electronic systems, and continuous development is expected in the future. However, significant obstacles to further reduction in feature size are being encountered. These obstacles include defect density control, optical system resolution limits, and availability of processing material and equipment. Attention has therefore increasingly shifted to semiconductor packaging as a means to fulfill the relentless demands for cost reduction.

One proven way to reduce cost is to use mature package technologies with existing manufacturing methods and equipments. Paradoxically, the reuse of existing manufacturing processes does not typically result in the reduction of package dimensions.

Thus, a need still remains for an integrated circuit packaging system including lower cost, smaller size, and more functionality. In view of the ever-increasing need to improve integration and cost reduction, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: mounting a substrate-less integrated circuit package, having a terminal having characteristics of an intermetallic compound, over a substrate; connecting the substrate and the substrate-less integrated circuit package; and forming a base encapsulation over the substrate-less integrated circuit package with the terminal exposed.

The present invention provides an integrated circuit packaging system, including: a module including: a substrate; a substrate-less integrated circuit package, having a terminal having characteristics of an intermetallic compound, over and connected to the substrate; and a base encapsulation over the substrate-less integrated circuit package with the terminal exposed.

Certain embodiments of the invention have other steps or elements in addition to or in place of those mentioned above. The steps or element will become apparent to those skilled in the art from a reading of the following detailed description when taken with reference to the accompanying drawings.

BEST MODE FOR CARRYING OUT THE INVENTION

Figure 1:
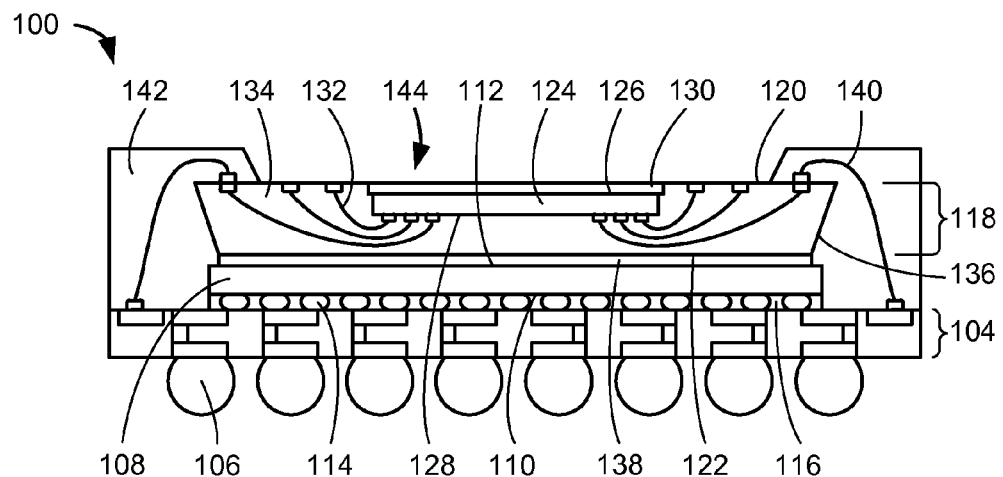
FIG. 1 is a cross-sectional view of an integrated circuit packaging system along a section line 1-1 of FIG. 2 in an embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGs. Similarly, although the views in the drawings for ease of description generally show similar orientations, this depiction in the FIGs. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane or surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is direct contact between elements. The term "directly on" means that there is direct contact between one element and another element without an intervening element.

The term "processing" as used herein includes deposition of material or photoresist, patterning, exposure, development, etching, cleaning, and/or removal of the material or photoresist as required in forming a described structure.

Figure 2:
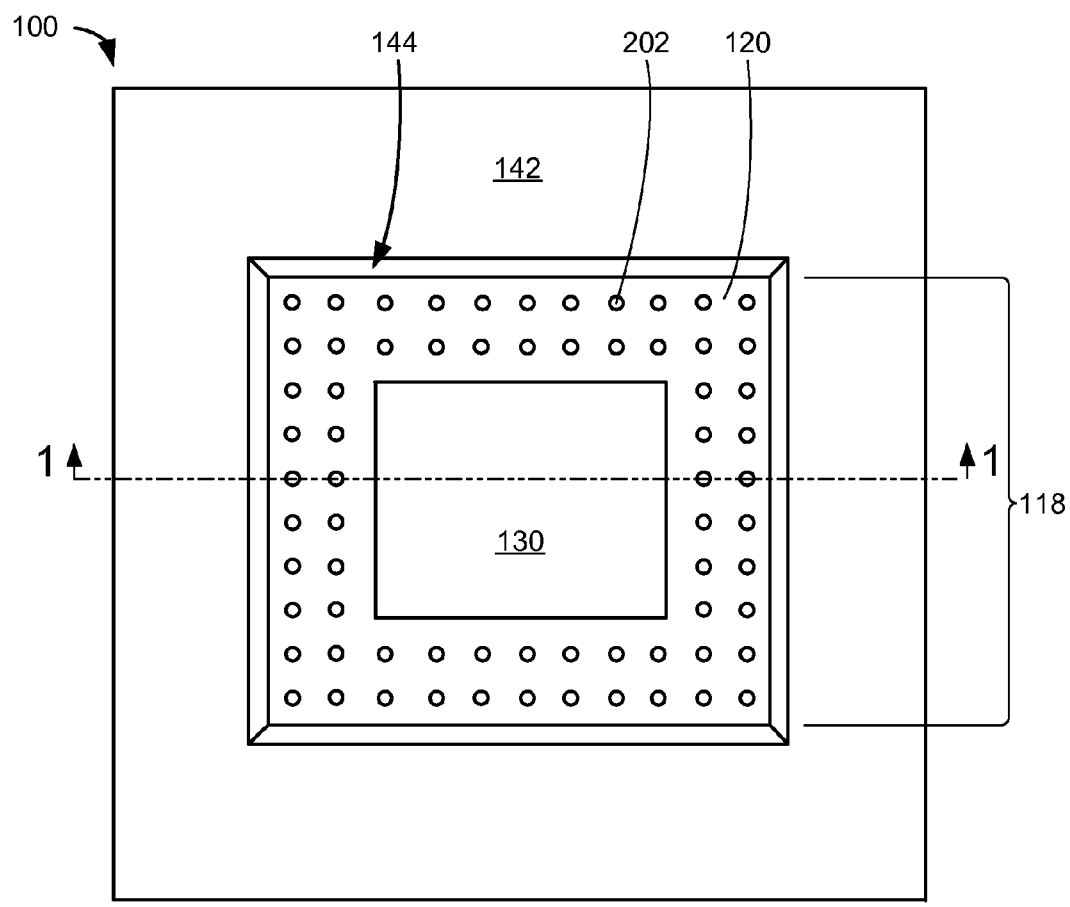
FIG. 2 is a top view of the integrated circuit packaging system.

Referring now to FIG. 1, therein is shown a cross-sectional view of an integrated circuit packaging system 100 along a section line 1-1 of FIG. 2 in an embodiment of the present invention. The integrated circuit packaging system 100 can represent a configuration of a packaging system, which can include a Bottom Fan-in Package-on-Package (FiPoPb) package.

The integrated circuit packaging system 100 can be formed with a substrate 104, such as a laminated plastic or ceramic substrate, an organic or inorganic substrate, a carrier, or a printed circuit board (PCB). The substrate 104 can include bond sites, conductive layers, or traces, for providing electrical connectivity. The integrated circuit packaging system 100 can include an external interconnect 106, such as a solder bump or a solder ball, attached to a bottom surface of the substrate 104 for providing electrical connectivity to external systems (not shown).

The integrated circuit packaging system 100 can include a base device 108, such as a flip-chip, a mother chip, an integrated circuit die, a packaged integrated circuit, or a bumped chip, mounted over the substrate 104. The base device 108 can include a base device active side 110 having active circuitry thereon and a base device inactive side 112, such as a backside, at an opposing side to the base device active side 110.

The base device 108 can be attached to the substrate 104 with a base device interconnect 114, such as a solder ball, a stud bump, or a solder column. The base device interconnect 114 can be electrically connected to the substrate 104 and the base device active side 110.

The integrated circuit packaging system 100 can include an underfill 116, such as an epoxy resin or any underfill resin material, dispensed in a space between the substrate 104 and the base device 108. The underfill 116 can protect or encapsulate the base device interconnect 114.

The integrated circuit packaging system 100 can include a substrate-less integrated circuit package 118, such as an Internal Stacking Module (ISM), a substrate-less (subless) ISM, an inner package, a package, a known good package (KGP), or a memory device. The substrate-less integrated circuit package 118 can be formed with a support structure, which can include a layer that can be removed in an assembly phase of the substrate-less integrated circuit package 118.

The substrate-less integrated circuit package 118 can include a first module surface 120 and a second module surface 122 opposing the first module surface 120. As an example, the first module surface 120 faces away from the substrate 104, and the second module surface 122 faces the substrate 104.

The substrate-less integrated circuit package 118 can be formed with an internal device 124, such as a daughter chip, a memory chip, a wirebond chip, or an integrated circuit die. The internal device 124 can include an internal device inactive side 126, such as a backside, and an internal device active side 128 having active circuitry thereon at an opposing side to the internal device inactive side 126.

The internal device 124 can be attached to the first module surface 120 with an internal attach layer 130, such as a die attach adhesive, a chip attach adhesive, or an adhesive film. The internal attach layer 130 or the internal adhesive layer 130 can be provided with thermally conductive capabilities. The internal attach layer 130 can be coplanar with the first module surface 120 and attached to the internal device inactive side 126 of the internal device 124.

The substrate-less integrated circuit package 118 can include a module interconnect 132, such as a bond wire or a conductive wire, exposed at the first module surface 120 and attached to the internal device 124. The module interconnect 132 can be attached to the internal device active side 128.

The substrate-less integrated circuit package 118 can include a module encapsulation 134, such as a cover including an epoxy molding compound, an encapsulation material, or a molding material. The module encapsulation 134 can expose and be substantially coplanar with a portion of the internal attach layer 130 and a portion of the module interconnect 132.

The internal attach layer 130 and the module interconnect 132 can be partially exposed from the module encapsulation 134. The portion of the internal attach layer 130 or the portion of the module interconnect 132 can be exposed from the module encapsulation 134.

The module encapsulation 134 can include a taper edge 136, which can include a surface formed between the first module surface 120 and the second module surface 122. The taper edge 136 can be slanted to facilitate a release of a mold system (not shown) in a molding process of the module encapsulation 134.

The integrated circuit packaging system 100 can include an inter-device attach layer 138, such as an adhesive, a spacer, an electromagnetic interference shield for blocking potentially disruptive energy fields, or a combination thereof. The inter-device attach layer 138 can include thermally conductive capabilities. The substrate-less integrated circuit package 118 can be mounted or attached over the base device 108 with the inter-device attach layer 138.

The inter-device attach layer 138 can be attached to the base device 108 and the substrate-less integrated circuit package 118. The inter-device attach layer 138 can be attached to the base device inactive side 112 and the second module surface 122.

The integrated circuit packaging system 100 can include a package interconnect 140, such as a bond wire, a conductive wire, or a z-interconnection, attached or connected to the substrate 104 and the substrate-less integrated circuit package 118. The package interconnect 140 can be attached to the first module surface 120.

The integrated circuit packaging system 100 can include a base encapsulation 142, such as a cover including an epoxy molding compound, an encapsulation material, or a molding material. The base encapsulation 142 can be formed over the substrate 104 covering the base device 108, a portion of the substrate-less integrated circuit package 118, and the package interconnect 140.

The base encapsulation 142 can be formed to partially expose the substrate-less integrated circuit package 118. The base encapsulation 142 can be formed to partially expose the first module surface 120. The base encapsulation 142 can be formed to include a cavity 144. The cavity 144 can expose a portion of the substrate-less integrated circuit package 118. The cavity 144 can expose the internal attach layer 130 and the module interconnect 132.

It has been discovered that the present invention can provide an availability of various Fan-in Package-on-Package (FiPoP) or Package-in-Package (PiP) structures. For example, the present invention can provide the integrated circuit packaging system 100 as the Bottom Fan-in Package-on-Package (FiPoPb) package. The integrated circuit packaging system 100 can include the substrate-less integrated circuit package 118, having the portion of the first module surface 120 exposed from the base encapsulation 142 in the cavity 144, mounted over the base device 108.

It has also been discovered that the present invention provides an integrated circuit packaging system with a reduced profile. The present invention provides the substrate-less integrated circuit package 118 having the internal device 124 attached by the internal attach layer 130. The substrate-less integrated circuit package 118 provides electrical connectivity to external devices with the module interconnect 132 exposed at the first module surface 120 and attached to the internal device 124. A package profile (e.g. a vertical profile or a height) can be reduced by providing the substrate-less integrated circuit package 118 as a substrate-less (subless) internal stacking module (ISM).

A subless ISM structure simultaneously protects and provides connectivity to the internal device 124 while reducing the height required for the substrate-less integrated circuit package 118. The height can be further reduced with other module interconnect technologies, such as reverse standoff stitch bonding or rigid z-interconnect, to eliminate loop height for bond wires. The thickness of the internal attach layer 130 can be reduced or controlled to further reduce the module height.

It has yet also been discovered that the present invention can improve reliability. The reliability can be improved by providing the substrate-less integrated circuit package 118 protected by the module encapsulation 134, thereby providing a minimum warpage failure and cost saving. The substrate-less integrated circuit package 118 can be pretested without assembly with the integrated circuit packaging system 100, further improving overall reliability.

It has further been discovered that the present invention can simplify a process flow. The process flow can be simplified by eliminating any unnecessary process step. The present invention can provide the substrate-less integrated circuit package 118, having the internal device 124, mounted over the base device 108. For example, the substrate-less integrated circuit package 118 can be mounted over the base device 108 without a dummy chip, a spacer die, or a dummy silicon spacer attach. As such, the present invention can simplify the process flow, thereby providing a cost or process step saving.

It has yet further been discovered that the present invention can increase an Assembly and Test yield and lower cost. The Assembly and Test yield can be increased by providing the integrated circuit packaging system 100 having the substrate-less integrated circuit package 118, which can include a known good package (KGP) that is fully tested (e.g. in an ISM application).

It has yet further been discovered that the present invention can provide sufficient input/output counts. The sufficient input/output counts can be provided by the substrate-less integrated circuit package 118 (e.g. an interposer) having the first module surface 120 partially exposed from the base encapsulation 142. The module interconnect 132 partially exposed from the base encapsulation 142 on the first module surface 120 can provide the sufficient input/output counts.

Referring now to FIG. 2, therein is shown a top view of the integrated circuit packaging system 100. The top view depicts a portion of the substrate-less integrated circuit package 118 exposed by the cavity 144 of the base encapsulation 142. The cavity 144 exposes a portion of the first module surface 120.

The cavity 144 also exposes the internal attach layer 130 and a terminal 202, which is an exposed portion of the module interconnect 132 of FIG. 1. The terminal 202 can include characteristics of an intermetallic compound (IMC) layer. The characteristics of the IMC layer can include an interface layer that facilitates bonding between conductive materials, such as a metal or a conductor, and the module interconnect 132 attached thereto. The IMC layer tends to be more brittle than the conductors which form the mechanical connections.

Figure 3:
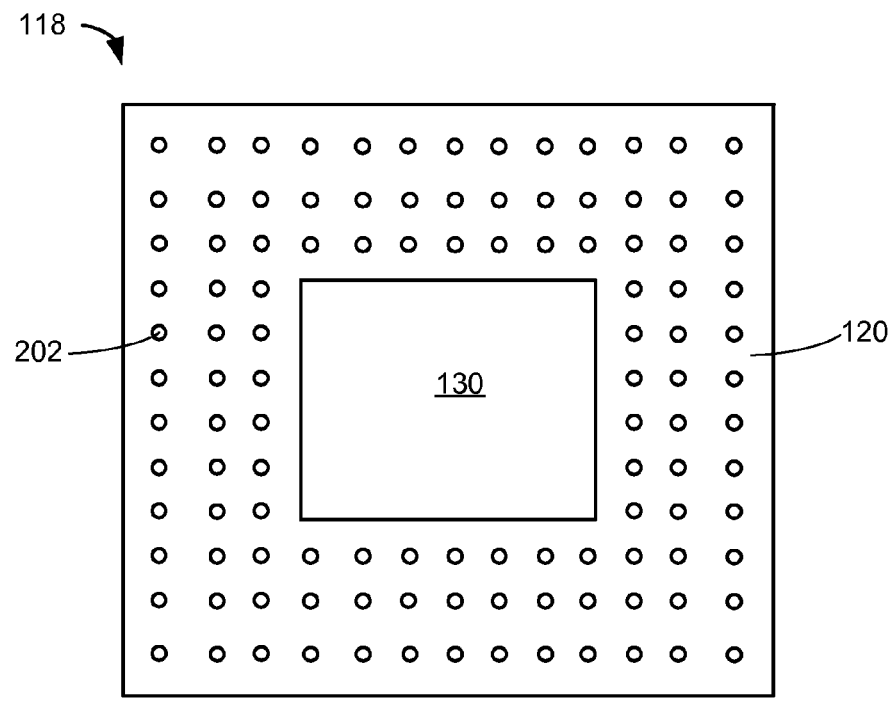
FIG. 3 is a bottom view of the substrate-less integrated circuit package.

Referring now to FIG. 3, therein is shown a bottom view of the substrate-less integrated circuit package 118. The substrate-less integrated circuit package 118 can include the first module surface 120. The substrate-less integrated circuit package 118 can include the internal attach layer 130 and the terminal 202 exposed.

The bottom view depicts the terminal 202 in a peripheral array configuration. The terminal 202 can be formed in a fully populated array, a staggered configuration, or a multi-row configuration.

For illustrative purposes, the bottom view depicts the internal attach layer 130, although it is understood that the substrate-less integrated circuit package 118 can be formed in a different structure. For example, the substrate-less integrated circuit package 118 is formed with the internal device inactive side 126 of FIG. 1 exposed.

Figure 4:
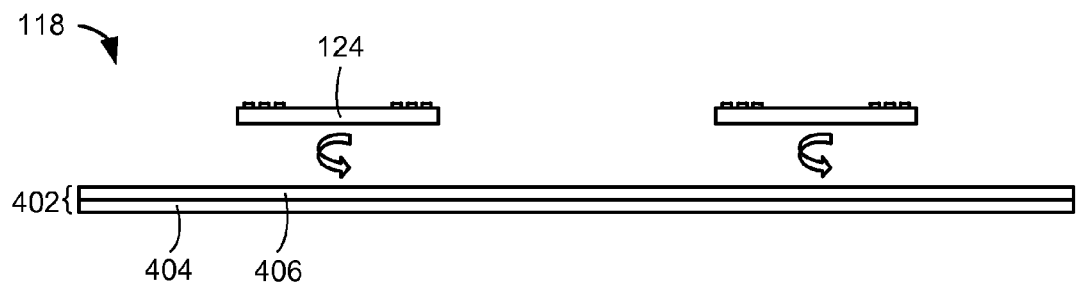
FIG. 4 is a cross-sectional view of the substrate-less integrated circuit package along the section line 1-1 of FIG. 2 in an assembly process of a providing phase of a sacrificial layer.

Referring now to FIG. 4, therein is shown a cross-sectional view of the substrate-less integrated circuit package 118 along the section line 1-1 of FIG. 2 in an assembly process of a providing phase of a sacrificial layer 402. The sacrificial layer 402 can function to support the internal device 124.

The sacrificial layer 402 can include a support layer 404, which can include a substrate, a carrier, a PCB, or a tape carrier. The support layer 404 can include any support structure that can include laminate, plastic, ceramic, organic, or inorganic material.

The sacrificial layer 402 can include a conductive layer 406 over the support layer 404. As an example, the sacrificial layer 402 functions to provide planar rigidity for mounting the internal device 124. The support layer 404 can provide planar rigidity. The support layer 404 can include a substrate, a carrier, a PCB, or a tape carrier. The support layer 404 can include any support structure that can include laminate, plastic, ceramic, organic, or inorganic material.

The conductive layer 406 can also provide planar rigidity. The conductive layer 406 can include a disposable conductive metal layer, a conductor, or any material for attaching an electrical interconnect thereto. The conductive layer 406 can include any number of conductive or metal layers. The conductive layer 406 can be formed or deposited over or on the support layer 404. The sacrificial layer 402 can be pre-formed with the support layer 404 and the conductive layer 406 attached thereto.

Figure 5:
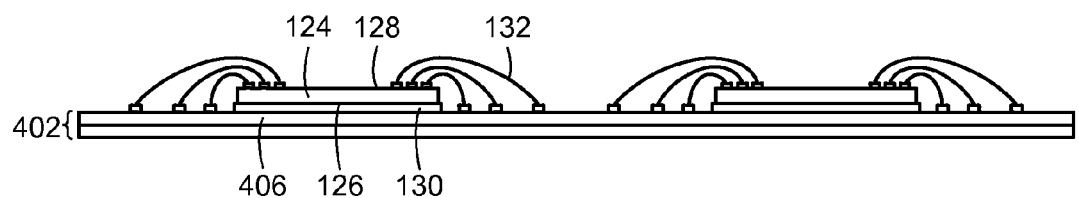
FIG. 5 is a cross-sectional view of the structure of FIG. 4 in an attachment phase of the internal device.

Referring now to FIG. 5, therein is shown a cross-sectional view of the structure of FIG. 4 in an attachment phase of the internal device 124. The internal device 124 is shown attached to the sacrificial layer 402 with the internal attach layer 130. The internal attach layer 130 can be attached to the internal device inactive side 126 and the conductive layer 406.

The module interconnect 132 is shown attached or connected between the internal device active side 128 and the conductive layer 406, resulting in the intermetallic compound (IMC) layer at the attachment site between the module interconnect 132 and the conductive layer 406. The module interconnect 132 can be attached with a bonding process.

Figure 6:
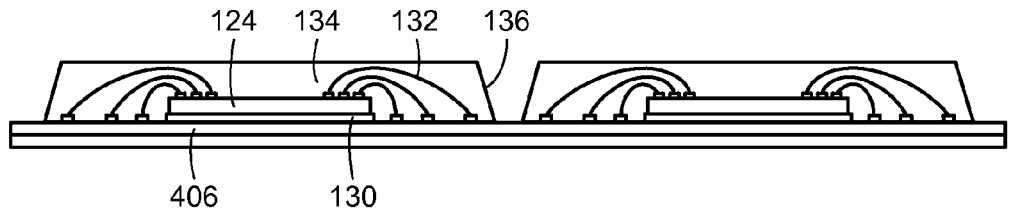
FIG. 6 is a cross-sectional view of the structure of FIG. 5 in a molding phase of the module encapsulation.

Referring now to FIG. 6, therein is shown a cross-sectional view of the structure of FIG. 5 in a molding phase of the module encapsulation 134. The module encapsulation 134 is shown formed over the conductive layer 406 covering the internal device 124, the internal attach layer 130, and the module interconnect 132.

The module encapsulation 134 can have the taper edge 136 as its non-horizontal sides. The taper edge 136 can be slanted or at an obtuse angle to the horizontal to facilitate a release of a mold system (not shown) in a molding process of the module encapsulation 134.

Figure 7:
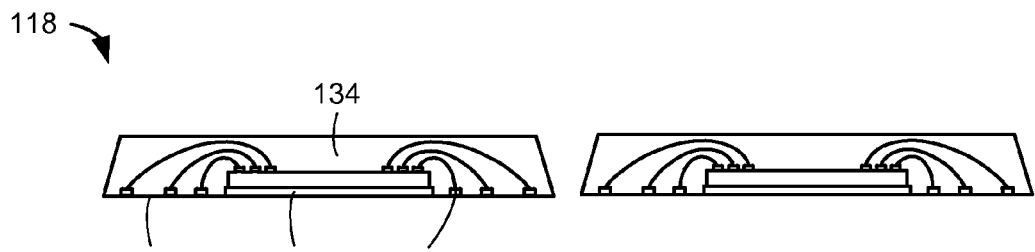
FIG. 7 is a cross-sectional view of the structure of FIG. 6 in a removal phase of the sacrificial layer of FIG. 5.

Referring now to FIG. 7, therein is shown a cross-sectional view of the structure of FIG. 6 in a removal phase of the sacrificial layer 402 of FIG. 5. The sacrificial layer 402 can be removed from the first module surface 120 of the substrate-less integrated circuit package 118. The sacrificial layer 402 can be removed by etching or peeling.

Besides etching, the sacrificial layer 402 can be removed by other types of processes including mechanical, chemical, or laser processes. For example, grinding, sanding, or any other mechanical or chemical means can remove the sacrificial layer 402.

The first module surface 120 can be substantially coplanar with a portion of the internal attach layer 130, the terminal 202, or a bottom surface of the module encapsulation 134. The portion of the internal attach layer 130 and the terminal 202 can be exposed from or substantially coplanar with the module encapsulation 134.

The first module surface 120 can include characteristics of the sacrificial layer 402 removed. The characteristics of the sacrificial layer 402 removed can include physical features, such as an etched surface, grinding marks, sanding marks, polishing marks, other removal tool marks, chemical residue, or a chemically processed surface.

With the sacrificial layer 402 removed, the internal attach layer 130 and the terminal 202 can be partially exposed from the module encapsulation 134. The terminal 202 can be formed by removing the conductive layer 406 and exposing the intermetallic compound layer of the terminal 202. The terminal 202 has characteristics of the intermetallic compound formed with the module interconnect 132 attached to the conductive layer 406 of FIG. 6. After the removal phase, singulation can be performed by mechanical or optical means, such as cutting, sawing, or laser scribing, to produce individual package units of the substrate-less integrated circuit package 118.

Figure 8:
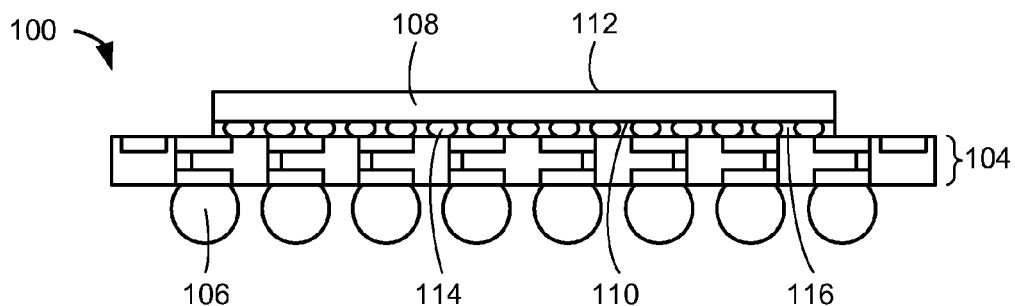
FIG. 8 is a cross-sectional view of the integrated circuit packaging system along the section line 1-1 of FIG. 2 in an assembly process of an attachment phase of the base device.

Referring now to FIG. 8, therein is shown a cross-sectional view of the integrated circuit packaging system 100 along the section line 1-1 of FIG. 2 in an assembly process of an attachment phase of the base device 108. The cross-sectional view is depicted with a portion of the integrated circuit packaging system 100. The cross-sectional view is depicted for a process flow that can include a preparation of the FiPoPb.

The cross-sectional view depicts the external interconnect 106 attached to a bottom surface of the substrate 104 for providing electrical connectivity to external systems. The integrated circuit packaging system 100 can include the base device 108 mounted over the substrate 104. The base device 108 can include the base device active side 110 and the base device inactive side 112 at an opposing side to the base device active side 110.

The base device 108 can be attached to the substrate 104 with the base device interconnect 114. The base device interconnect 114 can be electrically connected to the substrate 104 and the base device 108. The base device interconnect 114 can be connected to the substrate 104 and the base device active side 110.

The integrated circuit packaging system 100 can include the underfill 116 dispensed in a space between the substrate 104 and the base device 108. The underfill 116 can protect or encapsulate the base device interconnect 114.

Figure 9:
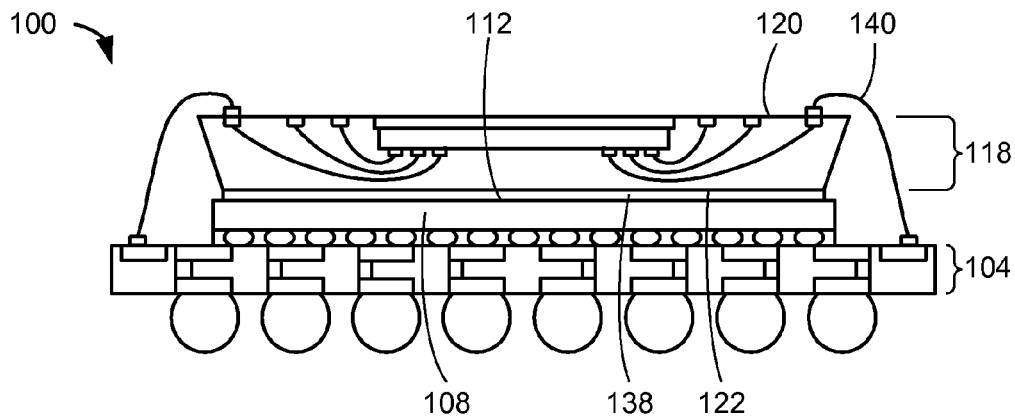
FIG. 9 is a cross-sectional view of the structure of FIG. 8 in an attachment phase of the substrate-less integrated circuit package.

Referring now to FIG. 9, therein is shown a cross-sectional view of the structure of FIG. 8 in an attachment phase of the substrate-less integrated circuit package 118. The integrated circuit packaging system 100 can include the substrate-less integrated circuit package 118, having the first module surface 120 and the second module surface 122 opposing the first module surface 120.

The substrate-less integrated circuit package 118 can be mounted or attached over the base device 108 with the inter-device attach layer 138. The inter-device attach layer 138 can be attached to the base device inactive side 112.

The integrated circuit packaging system 100 can include the package interconnect 140 attached to the substrate 104 and the substrate-less integrated circuit package 118. The package interconnect 140 can be attached to the first module surface 120.

Figure 10:
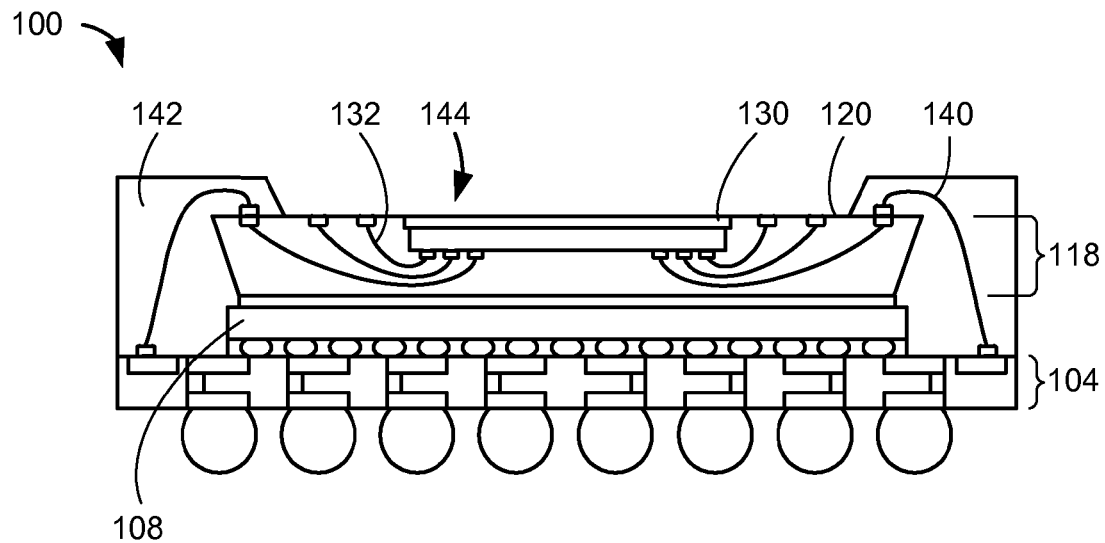
FIG. 10 is a cross-sectional view of the structure of FIG. 9 in a molding phase of the base encapsulation.

Referring now to FIG. 10, therein is shown a cross-sectional view of the structure of FIG. 9 in a molding phase of the base encapsulation 142. The integrated circuit packaging system 100 can include the base encapsulation 142. The base encapsulation 142 can be formed over the substrate 104 covering the base device 108, a portion of the substrate-less integrated circuit package 118, and the package interconnect 140.

The base encapsulation 142 can be formed to partially expose the substrate-less integrated circuit package 118. The base encapsulation 142 can be formed to partially expose the first module surface 120. The base encapsulation 142 can be formed to include the cavity 144.

The integrated circuit packaging system 100 can include a portion of the first module surface 120 exposed from the base encapsulation 142 in the cavity 144. The internal attach layer 130 and the module interconnect 132 can be partially exposed from the base encapsulation 142.

Figure 11:
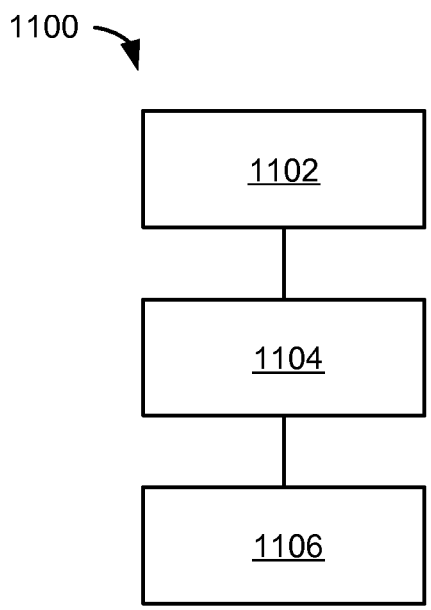
FIG. 11 is a flow chart of a method of manufacture of an integrated circuit packaging system in a further embodiment of the present invention.

Referring now to FIG. 11, therein is shown a flow chart of a method 1100 of manufacture of an integrated circuit packaging system in a further embodiment of the present invention. The method 1100 includes: mounting a substrate-less integrated circuit package, having a terminal having characteristics of an intermetallic compound, over a substrate in a block 1102; connecting the substrate and the substrate-less integrated circuit package in a block 1104; and forming a base encapsulation over the substrate-less integrated circuit package with the terminal exposed in a block 1106.

The resulting method, process, apparatus, device, product, and/or system is straightforward, cost-effective, uncomplicated, highly versatile, accurate, sensitive, and effective, and can be implemented by adapting known components for ready, efficient, and economical manufacturing, application, and utilization.

Another aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

What is claimed is:

1. A method of manufacture of an integrated circuit packaging system comprising:
   mounting a substrate-less integrated circuit package, having an internal adhesive layer and a terminal having characteristics of an intermetallic compound, over a substrate;
   connecting the substrate and the substrate-less integrated circuit package; and
   forming a base encapsulation over the substrate-less integrated circuit package with the terminal exposed, the base encapsulation having a cavity exposing the internal adhesive layer.

2. The method as claimed in claim 1 further comprising forming the substrate-less integrated circuit package having the terminal having characteristics of the intermetallic compound includes:
   connecting a module interconnect and a conductive layer resulting in the intermetallic compound layer at the attachment site; and
   forming the terminal by removing the conductive layer and exposing the intermetallic compound of the terminal.

3. The method as claimed in claim 1 further comprising forming the substrate-less integrated circuit package includes forming a module encapsulation substantially coplanar with the terminal.

4. The method as claimed in claim 1 further comprising forming the substrate-less integrated circuit package includes forming a module encapsulation having a taper edge.

5. The method as claimed in claim 1 wherein forming the base encapsulation includes forming the base encapsulation having the cavity exposing a portion of the substrate-less integrated circuit package.

6. A method of manufacture of an integrated circuit packaging system comprising:
   mounting a base device over a substrate;
   mounting a substrate-less integrated circuit package, with an internal adhesive layer and a terminal having characteristics of an intermetallic compound, over the base device;
   connecting a package interconnect to the substrate and the substrate-less integrated circuit package; and
   forming a base encapsulation over the substrate-less integrated circuit package with the terminal exposed, the base encapsulation having a cavity exposing the internal adhesive layer.

7. The method as claimed in claim 6 further comprising forming the substrate-less integrated circuit package includes forming the terminal in a multi-row configuration, the terminal exposed from the base encapsulation.

8. The method as claimed in claim 6 further comprising forming the substrate-less integrated circuit package includes forming a module encapsulation substantially coplanar with the internal adhesive layer and the terminal.

9. The method as claimed in claim 6 further comprising forming the substrate-less integrated circuit package includes forming a substrate-less Internal Stacking Module having a module encapsulation with a taper edge.

10. The method as claimed in claim 6 wherein forming the base encapsulation includes forming the base encapsulation having the cavity with a portion of the substrate-less integrated circuit package exposed therein.

11. An integrated circuit packaging system comprising:
    a substrate;
    a substrate-less integrated circuit package, having an internal adhesive layer and a terminal having characteristics of an intermetallic compound, over and connected to the substrate; and
    a base encapsulation over the substrate-less integrated circuit package with the terminal exposed, the base encapsulation having a cavity exposing the internal adhesive layer.

12. The system as claimed in claim 11 wherein the substrate-less integrated circuit package includes the terminal in a multi-row configuration.

13. The system as claimed in claim 11 wherein the substrate-less integrated circuit package includes a module encapsulation substantially coplanar with the terminal.

14. The system as claimed in claim 11 wherein the substrate-less integrated circuit package includes a module encapsulation having a taper edge.

15. The system as claimed in claim 11 wherein the base encapsulation includes the base encapsulation having the cavity exposing a portion of the substrate-less integrated circuit package.

16. The system as claimed in claim 11 further comprising:
    a base device over the substrate; and
    a package interconnect connected to the substrate and the substrate-less integrated circuit package.

17. The system as claimed in claim 16 wherein the substrate-less integrated circuit package includes the terminal in a multi-row configuration, the terminal exposed from the base encapsulation.

18. The system as claimed in claim 16 wherein the substrate-less integrated circuit package includes a module encapsulation substantially coplanar with a portion of the internal adhesive layer and the terminal.

19. The system as claimed in claim 16 wherein the substrate-less integrated circuit package includes a substrate-less Internal Stacking Module having a module encapsulation with a taper edge.

20. The system as claimed in claim 16 wherein the base encapsulation includes the base encapsulation having the cavity with a portion of the substrate-less integrated circuit package exposed therein.

* * * * *